US006508300B1

(12) United States Patent
Hegde

(10) Patent No.: US 6,508,300 B1
(45) Date of Patent: Jan. 21, 2003

(54) SPRING CLIP FOR A COOLING DEVICE

(75) Inventor: Shankar Hegde, Annassandrapalya Bangalore (IN)

(73) Assignee: Hewlett Packard Company, Palo Alto, CA (US)

( * ) Notice: Subject to any disclaimer, the term of this patent is extended or adjusted under 35 U.S.C. 154(b) by 0 days.

(21) Appl. No.: 09/916,477

(22) Filed: Jul. 27, 2001

(51) Int. Cl.[7] .................................................. H05K 7/20
(52) U.S. Cl. .................... 165/80.3; 24/457; 257/719; 361/704
(58) Field of Search ................ 165/80.3, 185; 257/718, 719; 174/16.3; 361/704; 24/457

(56) References Cited

U.S. PATENT DOCUMENTS

| | | | | |
|---|---|---|---|---|
| 5,208,731 | A | * | 5/1993 | Blomquist ................ 174/16.3 |
| 5,241,453 | A | * | 8/1993 | Bright et al. ............... 361/704 |
| 5,302,853 | A | * | 4/1994 | Volz et al. ................. 257/718 |
| 5,381,305 | A | * | 1/1995 | Harmon et al. ............ 361/704 |
| 5,889,653 | A | | 3/1999 | Clemens et al. |
| 5,909,358 | A | | 6/1999 | Bradt |
| 5,917,700 | A | | 6/1999 | Clemens et al. |
| 5,943,209 | A | * | 8/1999 | Liu ........................... 165/80.3 |
| 6,082,440 | A | | 7/2000 | Clemens et al. |
| 6,108,207 | A | | 8/2000 | Lee |
| 6,115,253 | A | | 9/2000 | Clemens et al. |
| 6,181,559 | B1 | | 1/2001 | Seo |
| 6,195,880 | B1 | | 3/2001 | Hinshaw et al. |
| 6,272,722 | B1 | * | 8/2001 | Lai ............................... 24/458 |
| 6,304,453 | B1 | * | 10/2001 | Lo ............................... 361/704 |
| 6,343,013 | B1 | * | 1/2002 | Chen ........................... 165/80.3 |
| 6,381,813 | B1 | * | 5/2002 | Lai ............................... 24/456 |

* cited by examiner

*Primary Examiner*—Leonard Leo
(74) *Attorney, Agent, or Firm*—Trueman H. Denny, III

(57) ABSTRACT

A spring clip that has rocking and force profiles with attachment configurations is disclosed. The spring clip made out of spring quality material such as stainless steel and the spring clip includes special provisions for mounting a cylindrical cooling device (i.e. a heat sink). Swinging arm principles are used to form force profiles that ensure that a load center of the clip is always on a fulcrum axis thereby focusing the force of the clip on a required load axis. The spring clip can accommodate higher manufacturing deviations without sacrificing the functional requirements. Moreover, the spring clip allows the heat sink to be inserted and then rotated in order to mount the heat sink on the component to be cooled thereby ensuring easy insertion of the heat sink and easy removal of the heat sink when the component being cooled requires replacement or repair. The spring clip can be manufactured at a low cost using stamping and forming processes.

20 Claims, 13 Drawing Sheets

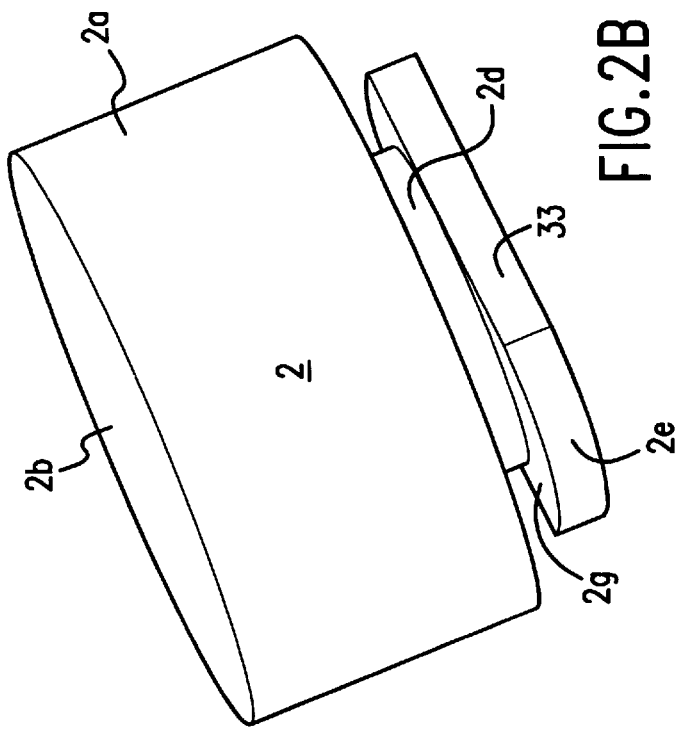
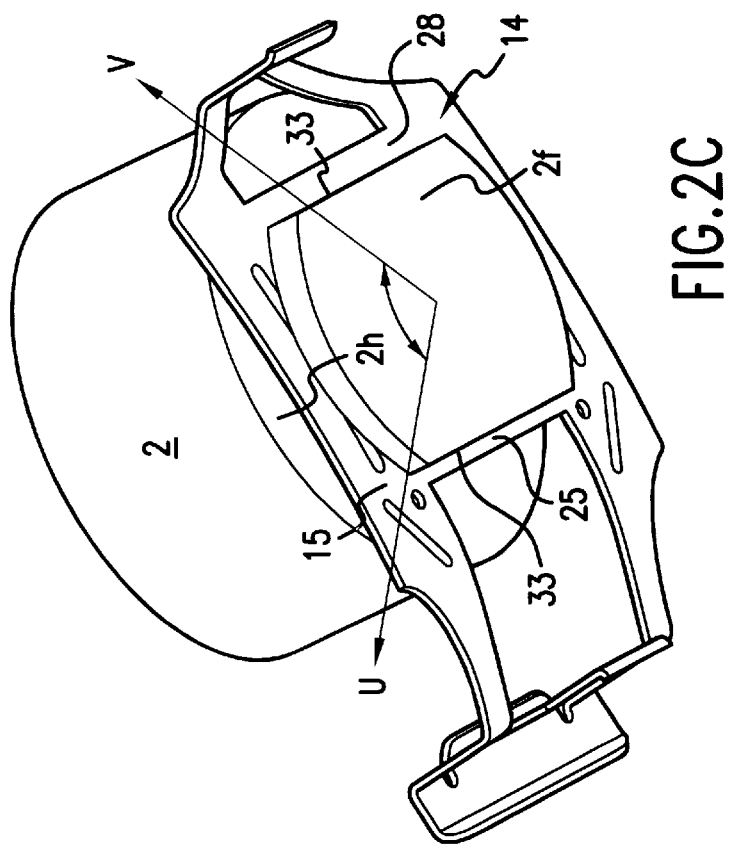

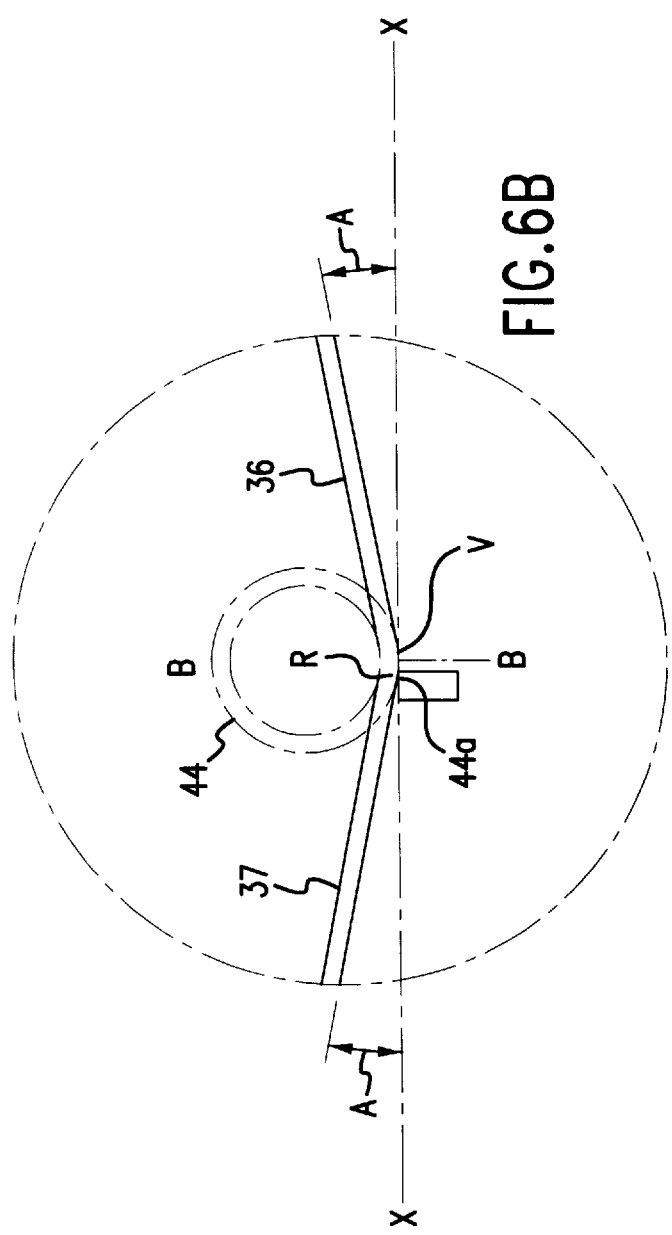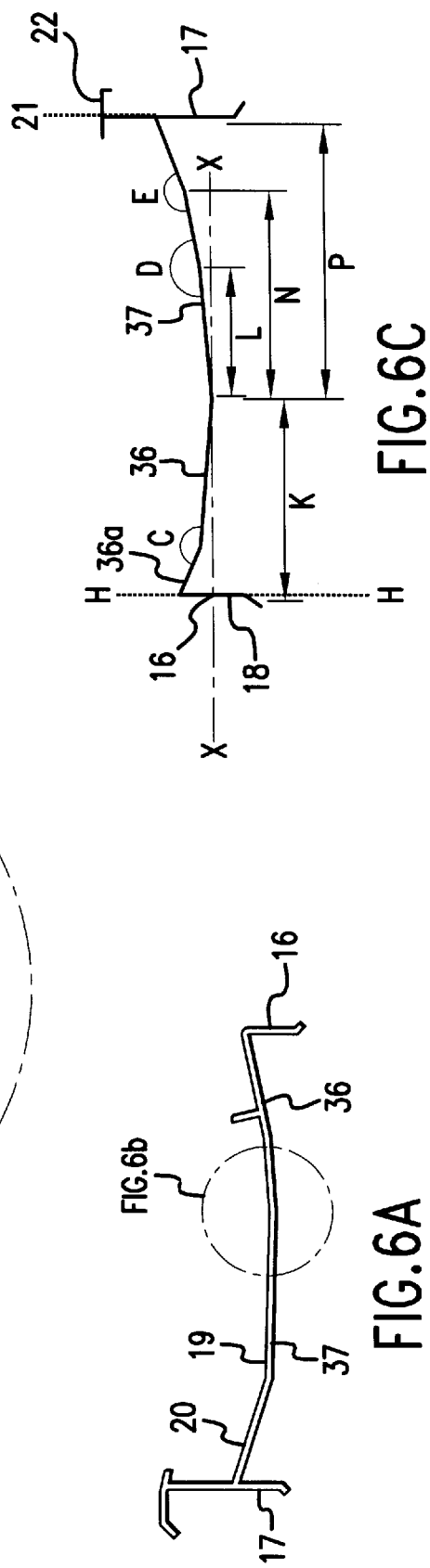

SPRING CLIP FOR A COOLING DEVICE

FIELD OF THE INVENTION

The present invention relates generally to a spring clip for mounting a cooling device to a component to be cooled. More specifically, the present invention relates to a spring clip including swing arms with rocking and force profiles that ensure self-alignment of the cooling device with the component so that a load imparted on the cooling device by the spring clip is applied substantially at a center of the component without restricting freedom of movement of the cooling device.

BACKGROUND OF THE INVENTION

It is well known in the electronics art to place a heat sink in contact with an electronic device so that waste heat generated by operation of the electronic device is thermally transferred into the heat sink thereby cooling the electronic device. With the advent of high clock speed electronic devices such as microprocessors (μP), digital signal processors (DSP), and application specific integrated circuits (ASIC), the amount of waste heat generated by those devices and the operating temperature of those devices are directly proportional to clock speed. Therefore, higher clock speeds result in increased waste heat generation which in turn increases the operating temperature of the device. However, efficient operation of the device requires that waste heat be effectively removed.

Heat sink devices came into common use as a preferred means for dissipating waste heat from electronic devices such as the types described above. In a typical application, a component to be cooled is carried by a connector that is mounted on a PC board. A heat sink is mounted on the component by attaching the heat sink to the connector using a clip or fasteners, for example. One disadvantage to using fasteners, such as screws or the like, is that holes must be drilled in the PC board to accommodate the screws and the amount of time necessary to mount the heat sink is longer.

Efficient dissipation of heat from the component by the heat sink depends to a large extent on the thermal contact between the heat sink and the component and the contact pressure between the heat sink and the component. Ideally, an attachment device, such as a clip, positions the heat sink so that the a surface of the heat sink that is in contact with the component is substantially flat and the contact pressure between the heat sink and component acts along a load axis that is centered on the component.

However, regardless of the technique used to attach the heat sink to the component, thermal contact and contact pressure can be adversely affected by manufacturing variations in the component, the heat sink, or both. Because the required manufacturing tolerance to obtain a substantially flat mating between the heat sink and the component while centering the load axis on a center of the component fall within a very narrow window and manufacturing variations can adversely impact heat dissipation resulting in inefficient operation of the component or component failure. Furthermore, in general, the attachment device is rigidly connected to the heat sink therefore restricting freedom of movement of the heat sink. The lack of freedom of movement coupled with the manufacturing variations results in a higher thermal resistance between the heat sink and the component.

Consequently, there exists a need for an attachment device that can compensate for manufacturing variations in the component, the heat sink, or both, while allowing for freedom of movement of the heat sink. There is also a need for an attachment device that allows for easy insertion and removal of a heat sink by hand and without the need for tools, fasteners, or the like. Moreover, there is a need for an attachment device that ensures a load axis of the attachment device is coaxial with an axis of the heat sink and with a center of the component to be cooled. Finally, there is a need for an attachment device that is easy to manufacture at a low cost.

SUMMARY OF THE INVENTION

The present invention solves the aforementioned problems. The spring clip of the present invention can be made from spring quality material such as steel and can be manufactured using low cost stamping and forming processes. Advantages of the stamping and forming processes include the ability to automate manufacturing of the spring clip so that the spring clip can be produced inexpensively.

Additionally, the stamping and forming processes result in an economy of material usage due to specially designed hinge and latch sides of the spring clip. Moreover, a shape of a handle on the latch side makes it easy to latch and unlatch the spring clip by hand; therefore, eliminating the need to use tools or the like to disassemble the heat sink from the component and/or the spring clip.

The problems associated with centering an axis of the heat sink with the center of the component are solved by load arms with a rocking profile at a load axis of the spring clip that ensure that the heat sink rests flat on the surface of the component and that a load applied by the spring clip is applied substantially at a center of the component and along the load axis.

Swing clearances provided on the load arms provide for manufacturing variations without sacrificing the functional needs of centering the load axis on the center of the component and ensuring flat mounting between the heat sink and the component. Moreover, the spring clip of the present invention can be mounted on round heat sinks as well as flat heat sinks.

In one embodiment of the present invention, the ribs include one or more embossed features that extend outward of the rib and allow for relative movement between the spring clip and the heat sink and increase the strength of the spring clip.

In another embodiment of the present invention, the spring clip can be made from a spring quality material.

In yet another embodiment of the present invention, the ribs have a vertex at a rocking axis of the spring clip and the ribs have a substantially circular profile. The circular profile is defined by a rocking radius of a circle that is substantially tangential with a base plane passing through the rocking axis.

Other aspects and advantages of the present invention will become apparent from the following detailed description, taken in conjunction with the accompanying drawings, illustrating by way of example the principles of the present invention.

BRIEF DESCRIPTION OF THE DRAWINGS

FIG. 2b is an isometric view of a heat sink illustrating surfaces thereof that are adapted to be inserted in a spring clip according to the present invention.

FIG. 2c is an isometric view of the heat sink of FIG. 2b locked in a spring clip according to the present invention.

FIGS. 6a through 6c are a schematic view of profiles of a spring clip according to the present invention.

DETAILED DESCRIPTION

Figure 1:
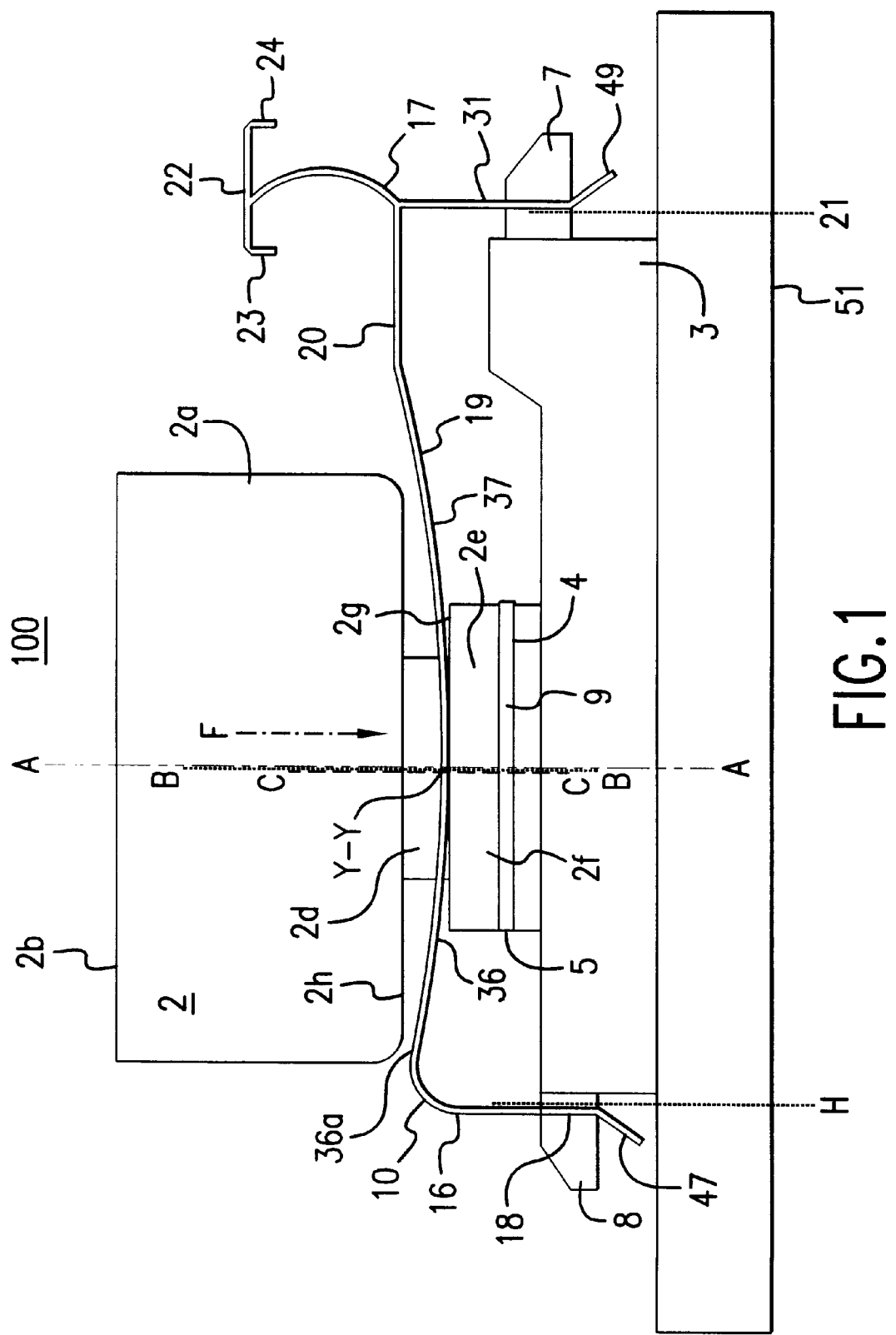
FIG. 1 is a perspective view of a spring clip mounting a heat sink on component according to the present invention.

In the following detailed description and in the several figures of the drawings, like elements are identified with like reference numerals.

As shown in the drawings for purpose of illustration, the present invention is embodied in a spring clip adapted to mount a cooling device to a component to be cooled. The component can be carried by a connector such as a socket mounted on a PC board, for example. The spring clip includes at least two spaced apart ribs that are substantially parallel to each other and substantially coplanar with each other. The ribs are divided into two portions, a latch arm and a hinge arm that are positioned on opposite sides of a rocking axis that is substantially perpendicular to the ribs and lies on a base plane passing through the rocking axis.

The latch and hinge arms are inclined at a rocking angle having a vertex at the rocking axis. Each hinge arm includes a first coplanar segment that is inclined at a first angle and at a bend distance from the rocking axis a hinge that is declined so that the hinge lies on a hinge plane. The ribs in the hinge converge on each other to define an aperture. The aperture can be movably hinged on the connector or on the component to facilitate connection and removal of the spring clip. The hinge arm also includes a plurality of notches formed therein and adapted to receive a locking rib that locks the cooling device in the spring clip. The locking rib is removable so that the cooling device can be removed from the spring clip.

Each latch arm includes a bridge that is substantially parallel to the rocking axis and is connected with the ribs. The bridge defines an opening between the ribs through which the cooling device is inserted or removed. Additionally, the latch arm includes a first section that is inclined at a first pressure angle measured between the latch arm and the first section and the first section has a vertex at a first distance from the rocking axis, a second section that is inclined at a second pressure angle measured between the first section and the second section and having a vertex at a second distance from the rocking axis.

The latch arms also include a latch assembly that is connected with the ribs of the latch arms and inclined at a third distance from the rocking axis so that the latch assembly is positioned on a latch plane and the latch assembly includes a latch having an aperture therein that allows the spring clip to be removably latched with the connector or the component, and a handle that is inclined at a second angle with respect to the latch plane. The handle allows the latch assembly to be gripped by a users hand, for instance.

Figure 3:
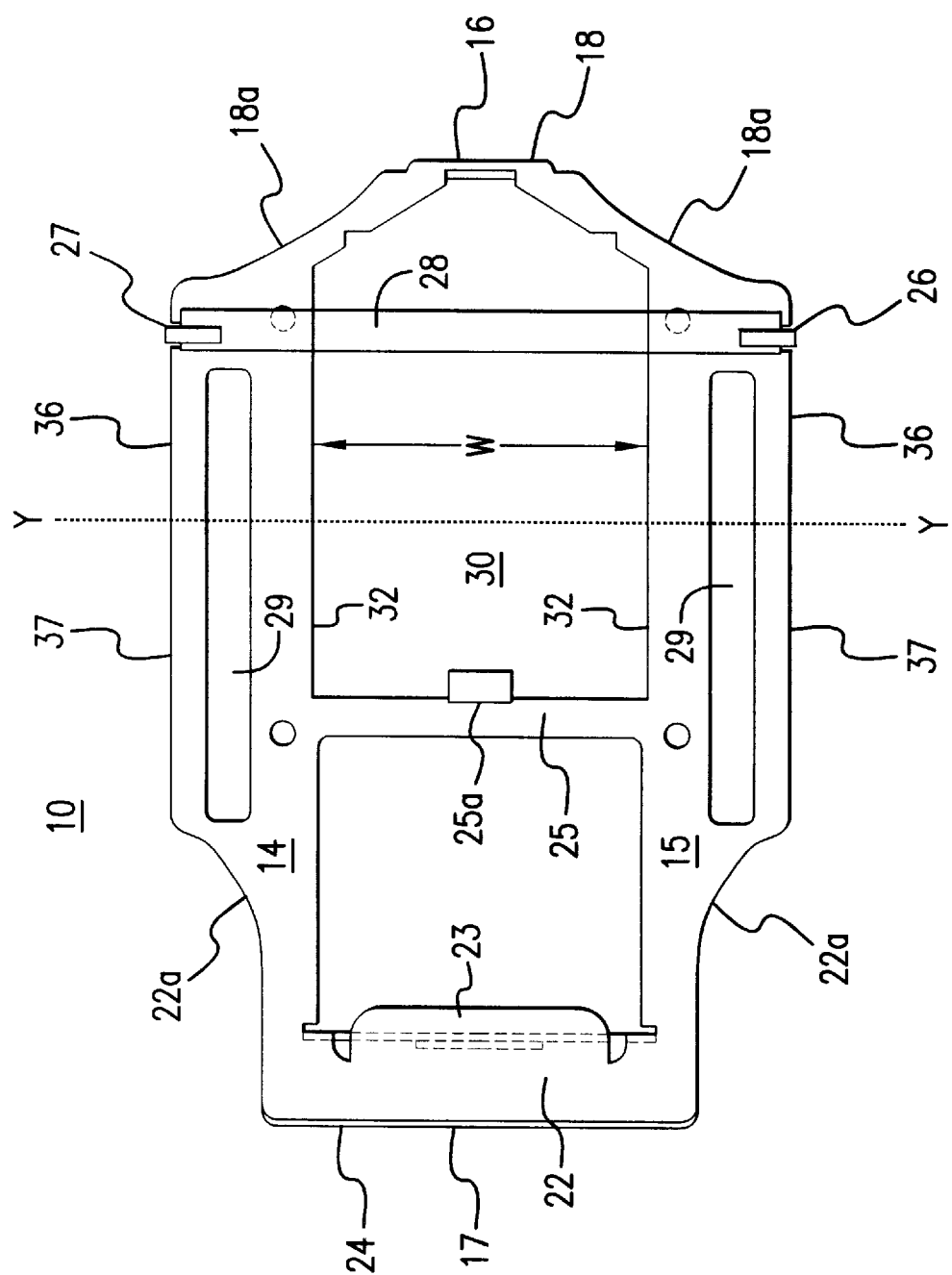
FIG. 3 is an elevation view of a spring clip according to the present invention.
Figure 4:
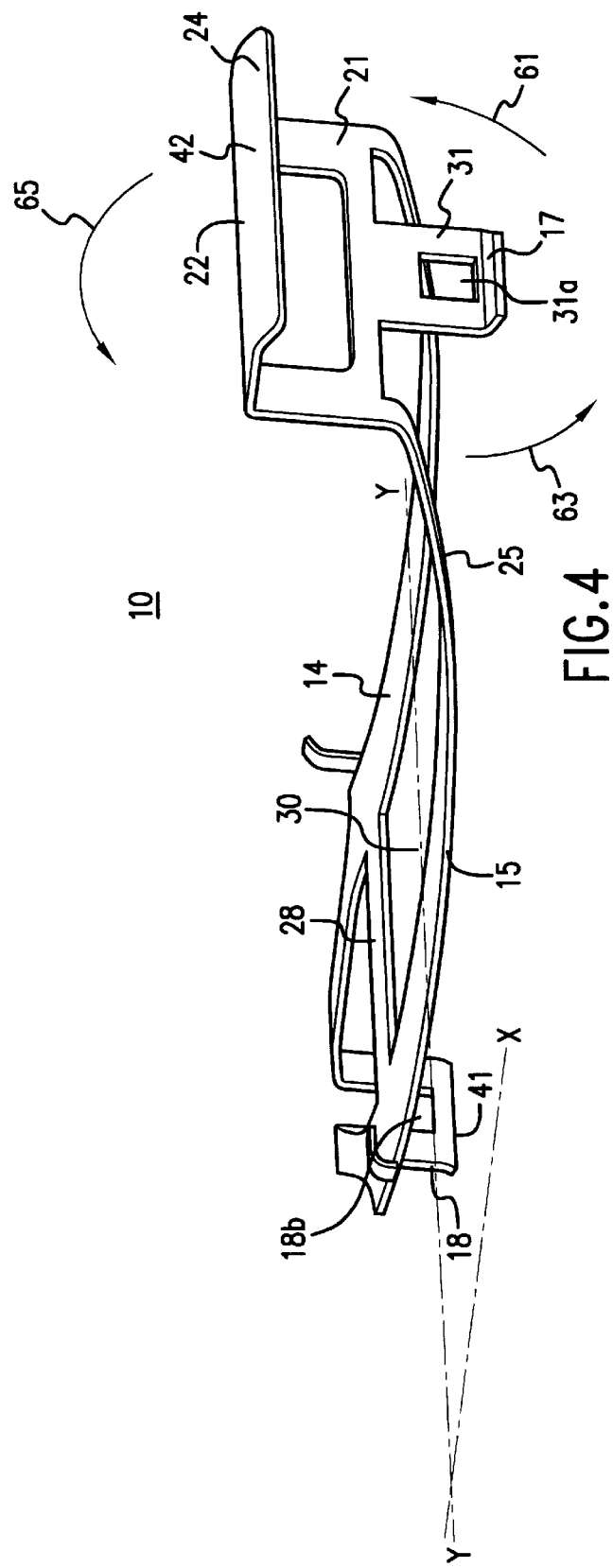
FIG. 4 is an isometric view of a spring clip with a locking rib according to the present invention.
Figure 9:
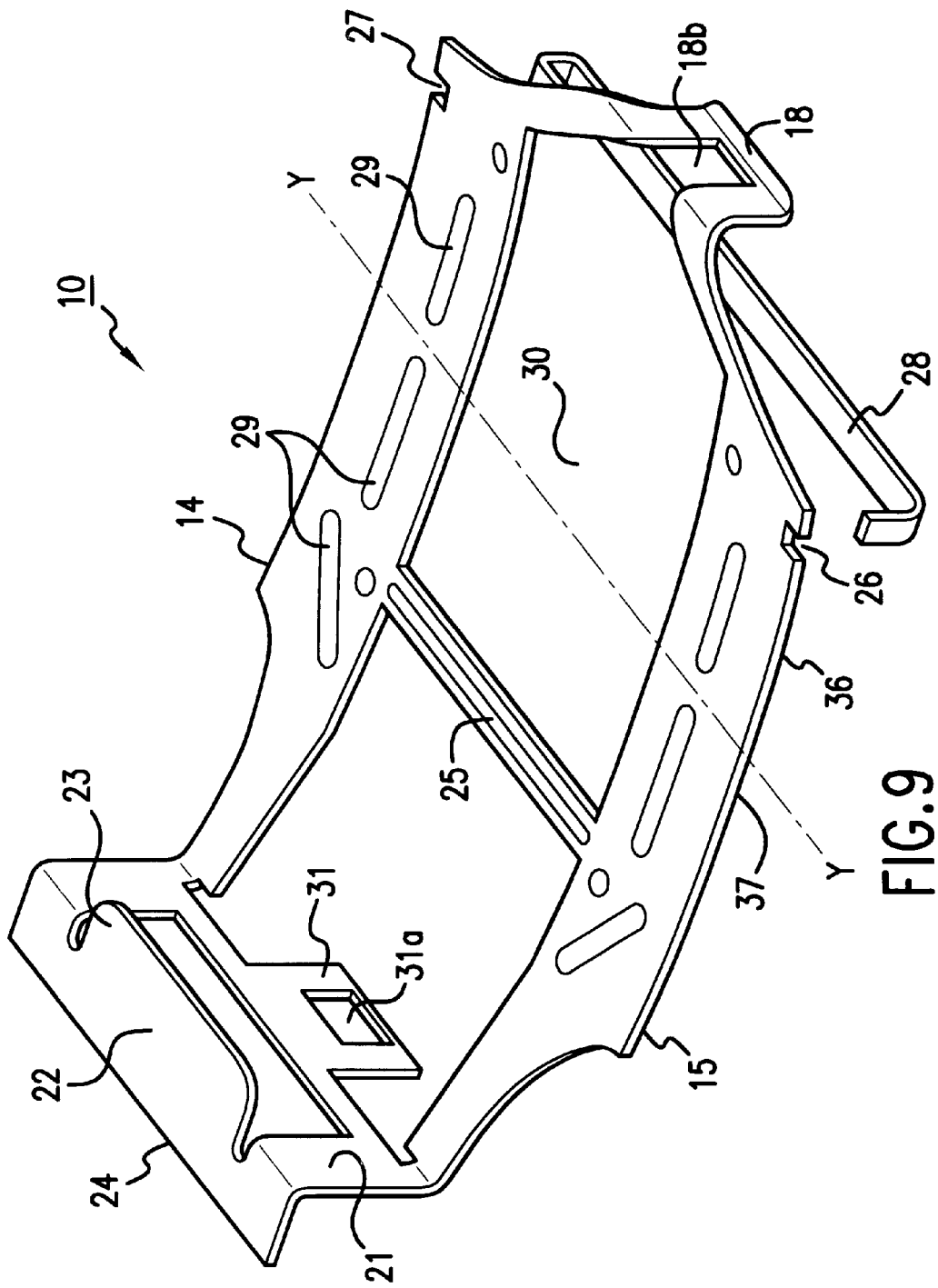
FIG. 9 is an isometric view of a spring clip and a locking rib according to the present invention.

In FIGS. 3, 4, and 9, a spring clip 10 includes at least two ribs (14, 15) that are spaced apart from each other. The ribs (14, 15) substantially span a hinge end 16 and a latch end 17 of the spring clip 10. Moreover, the ribs (14, 15) are substantially parallel and coplanar with each other and the ribs (14, 15) are substantially perpendicular to a rocking axis Y—Y. As illustrated in FIG. 4, the rocking axis Y—Y lies on a base plane X that passes through the rocking axis Y—Y. Each of the ribs (14,15) includes a hinge arm 36 and a latch arm 37 that are positioned on opposite sides of the rocking axis Y—Y (i.e. they are positioned astride the rocking axis Y—Y). In FIGS. 6a, 6b and 6c, the latch and hinge arms (36, 37) are inclined at a rocking angle A having a vertex V at the rocking axis Y—Y. The rocking angle A can be measured between the base plane X and the latch and hinge arms (36, 37) (see FIG. 6b). The rocking angle A can be in a range from about 2.0 degrees to about 45.0 degrees.

Each hinge arm 36 includes a first segment 36a that is inclined at a first angle C. As illustrated in FIG. 6c, the first angle C can be measured between the hinge arm 36 and the first segment 36a. Preferably, the first segment 36a on both of the hinge arms 36 are coplanar with each other such that their inclination at the first angle C places both first segments 36a on substantially identical angular planes. Each hinge arm 36 also includes a hinge 18 that is declined at a bend distance K from the rocking axis Y—Y. The hinge 18 is declined so that it lies on a hinge plane H. Preferably, the hinge plane H is substantially at a right angle (i.e. about 90.0 degrees) with the base plane X and the ribs (14, 15) in the hinge 18 converge on each other 18a (see FIG. 3) to define an aperture 18b (see FIGS. 7 and 9). The hinge 18 can be movably hinged on a connector (not shown) as will be described below. Each hinge arm 36 includes at least one notch (26, 27) formed in the ribs (14,15). The notches (26, 27) receive a removable locking rib 28 (see FIG. 9) that is used to lock a cooling device (not shown) in the spring clip 10.

Each latch arm 37 includes a first section 19 and a second section 20. The first section 19 is inclined at a first pressure angle D having a vertex at a first distance L from the rocking axis Y—Y and the second section 20 is inclined at a second pressure angle E having a vertex at a second distance N from the rocking axis Y—Y. The first pressure angle D can be measured between the latch arm 37 and the first section 19. Similarly, the second pressure angle E can be measured between the latch arm 37 and the second section 20 (see FIG. 6c).

In FIG. 9, the latch end 17 includes a bridge 25 that is connected with the latch arms 37 and is positioned substantially parallel to the rocking axis Y—Y. The bridge 25 defines an opening 30 through which the cooling device is inserted into the spring clip 10.

The spring clip 10 also includes a latch assembly 33 connected with the ribs (14, 15) of the latch arms 37. The latch assembly 33 is inclined at a third distance P from the rocking axis Y—Y so that the latch assembly 33 is positioned on a latch plane 21. Preferably, the latch plane 21 is substantially at a right angle (i.e. about 90.0 degrees) with the base plane X. The latch assembly 33 includes a latch 31 having an aperture 31a formed in the latch 31 and adapted to removably latch the spring clip 10 with the connector, and a handle 22 inclined at a second angle F with respect to the latch plane 21. The handle 22 is designed to allow the spring clip 10 to be latched and unlatched from the connector without the need to use tools. For instance, the handle 22 can be gripped by the hand of a user. Preferably, the second angle F is substantially at a right angle (i.e. about 90.0 degrees) with the latch plane 21.

Actual values for the first angle C, the bend distance K, the first pressure angle D, the first distance L, the second pressure angle E, the second distance N, and the third distance P are application specific and can vary based on several factors including but not limited to the size of the spring clip 10 and a desired magnitude of load the spring clip 10 is to exert on the cooling device, just to name a few. In one embodiment of the present invention, ranges for the above mentioned angles (in degrees) and the above mentioned distances (in millimeters) include but are not limited to: a range from about 3.0 degrees to about 30.0 degrees for the first angle C; a range from about 15.0 mm to about 30.0 mm for the bend distance K; a range from about 2.0 degrees to about 10.0 degrees for the first pressure angle D; a range from about 5.0 mm to about 18.0 mm for the first distance L; a range from about 5.0 degrees to about 20.0 degrees for the second pressure angle E; a range from about 10.0 mm to about 25.0 mm for the second distance N; and a range from about 20.0 mm to about 45.0 mm for the third distance P.

In FIG. 6*a*, at the rocking axis Y—Y, the ribs (14, 15) of the hinge and latch arms (36, 37) have an arcuate profile that is substantially tangential with the base plane X at the rocking axis Y—Y (i.e. the arcuate profile is tangential with the base plane X at the vertex V of the rocking angle A) as illustrated within a dashed circle EE. In FIG. 6*b*, the arcuate profile of the dashed circle EE is illustrated in greater detail. Preferably, the arcuate profile is a substantially circular profile defined by a circle 44 with a perimeter 44*a* at a rocking radius R from a center of the circle 44. The perimeter 44*a* is substantially tangential with the base plane X at the rocking axis Y—Y. A line through the center of the circle 44 defines a load axis B—B that is perpendicular to the base plane X and passes through the vertex V of the rocking angle A.

The operation of the spring clip 10 in conjunction with a cooling device and a component mounted in a connecter is illustrated in FIG. 1. In FIG. 1, a cooling system 100 includes the spring clip 10, a cooling device 2, a component 4, and a connector 3. Typically, the connector 3 is a socket or the like and is mounted on a substrate 51. For instance, the substrate 51 can be a PC board that electrically communicates signals to/from the component 4 via the connector 3. The connector includes tabs (7, 8) for connecting the latch and hinge (31, 18) of the spring clip 10 with the connector 3. Note that the hinge 18 is on the hinge side 16 and the latch 31 is on the latch side 17. The tabs (7, 8) are positioned on opposite sides of the connector 3. The cooling device 2 can be a heat sink that includes a heat sink body 2*a* having a plurality of cooling vanes or fins (not shown) and optionally a fan or the like mounted inside the cooling device 2 or mounted on an upper surface 2*b* thereof (not shown).

Additionally, the cooling device 2 includes a heat sink axis A—A, a base 2*e*, and a neck 2*d* that is smaller in cross-section than the base 2*e* so that the cooling device can be inserted through the opening 30 (not shown) in the spring clip 10, rotated in the opening 30, and then lock into the spring clip 10 using the locking rib 28 (not shown) as will be described below.

For purposes of illustration, in FIG. 1, the cooling device 2 is shown already inserted and locked into the spring clip 10. The base 2*e* includes a mounting surface 2*f* that is in contact with a face 9 of the component 4 so that heat generated by the component 4 is thermally communicated into the cooling device 2 and a contact surface 2*g* where the rocking axis Y—Y of the spring clip 10 contacts the base 2*e*. Preferably, the mounting surface 2*f* and the contact surface 2*g* are substantially planar surfaces and the heat sink axis A—A is substantially perpendicular to the mounting surface 2*f*.

In FIGS. 1 and 9, with the cooling device 2 mounted in the spring clip 10, the aperture 18*b* of the hinge 18 is hinged on the tab 8 and the aperture 31*a* of the latch 31 is latched onto the tab 7. Consequently, the spring clip 10 is removably connected with the connector 3 and the mounting surface 2*f* is contact with the face 9 of the component 4 with the heat sink axis A—A substantially aligned with a center axis C—C of the component 4 and the load axis B—B of the spring clip 10 is colinear with the heat sink axis A—A and the center axis C—C so that a load F acting on the cooling device 2 is applied substantially along heat sink axis A—A.

The present invention is not to be construed as being limited to the use of the tabs (7, 8) as the only means by which the latch 31 and the hinge 18 can be connected with the connector 3. A variety of means can be used to effectuate the connection of the spring clip 10 to the connector 3. For instance, the connector 3 can include a pair of indentations or cavities that are adapted to receive the hinge and the latch (18, 31). The indentations or cavities can have a shape that complements the shape of the hinge and the latch (18, 31). The spring clip 10 of the present invention can also be connected directly with the component 4 to be cooled. For example, given some minimum length of the latch and hinge arms (36, 37) that is necessary for generating a sufficient magnitude of the load F and operative to center the load axis B—B with the heat sink axis A—A of the cooling device 2, if the component 4 has a sufficient width that spans the combined length of the latch and hinge arms (36, 37), then the spring clip 10 can be directly connected with the component 4 using tabs (7, 8) or the like to engage the hinge 18 and the latch 31.

In one embodiment of the present invention, a thermal interface material 5 is positioned intermediate between the cooling device 2 and the component 4 and is in contact with the cooling device 2 and the component 4. The thermal interface material 5 can be positioned on the mounting surface 2*f* and/or the face 9. The thermal interface material 5 improves thermal communication between the component 4 and the cooling device 2 and seals micro voids in the mounting surface 2*f* and/or the face 9. Suitable materials for the thermal interface material include but are not limited to thermally conductive paste, thermally conductive grease, silicone, paraffin, a silicon (Si) substrate, a phase transition material, graphite, and carbon fiber.

Figure 10:
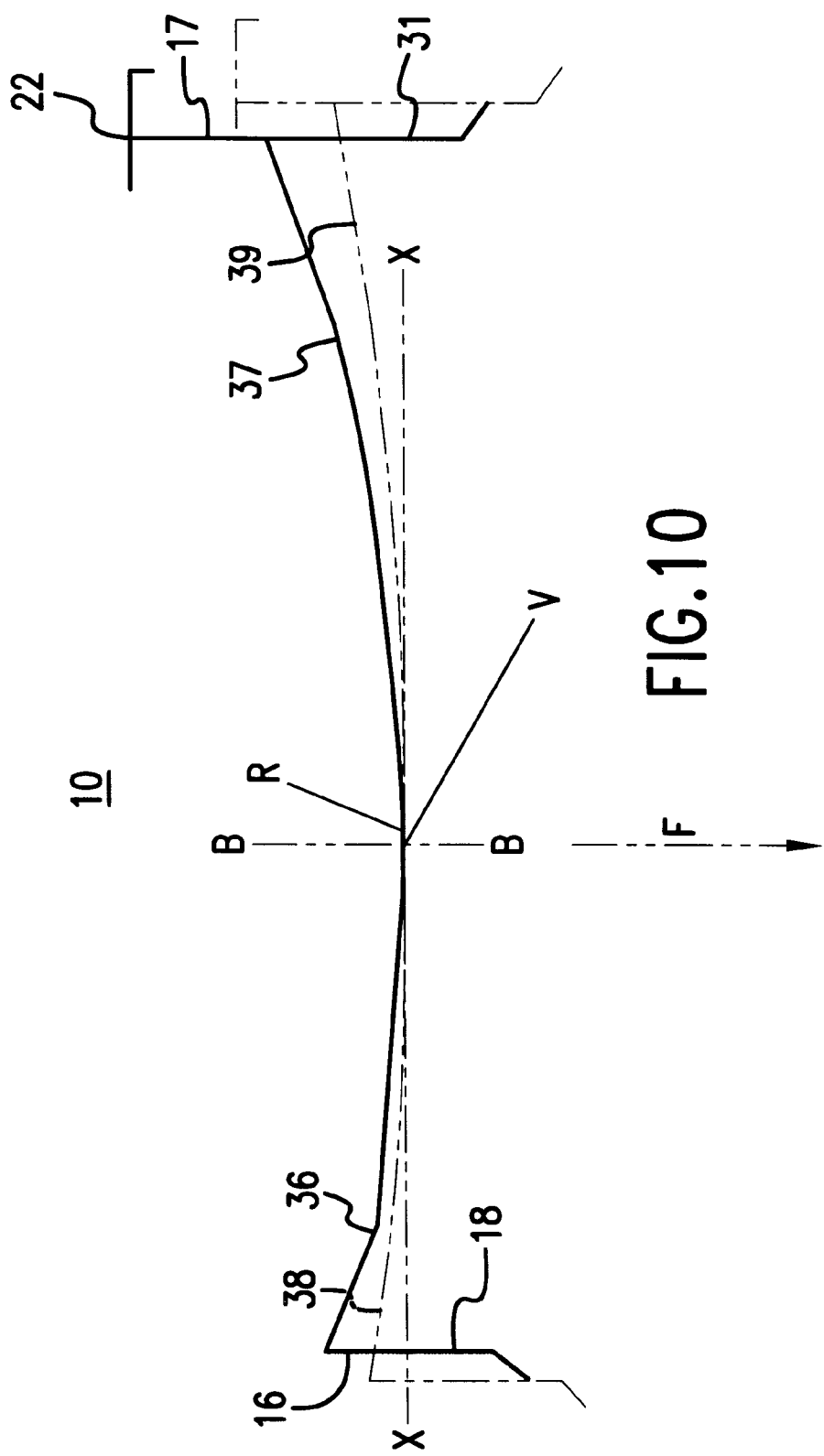
FIG. 10 is a schematic view of latch and hinge arm movements according to the present invention.

The load F and the effect that the profiles of the hinge and latch arms (36, 37) and the rocking axis Y—Y have on centering the load F along the heat sink axis A—A are illustrated in FIG. 10. In FIG. 10, the spring clip 10 is shown with the hinge and latch arms (36, 37) in an unlatched position (solid lines) and in a latched position (dashed lines with the hinge 36 and latch 37 arms denoted as 38 and 39 respectively). As the hinge and latch arms (36, 37) are moved from the unlatched to the latched position, the hinge and latch arms (36, 37) swing about rocking axis Y—Y and exert the load F at the load axis B—B and the rocking radius R allows the spring clip 10 to rock about the load axis B—B. That rocking effect accommodates for the aforementioned manufacturing variations in the cooling device 2 and/or the component 4 without shifting the load axis B—B from the heat sink axis A—A.

Figure 7:
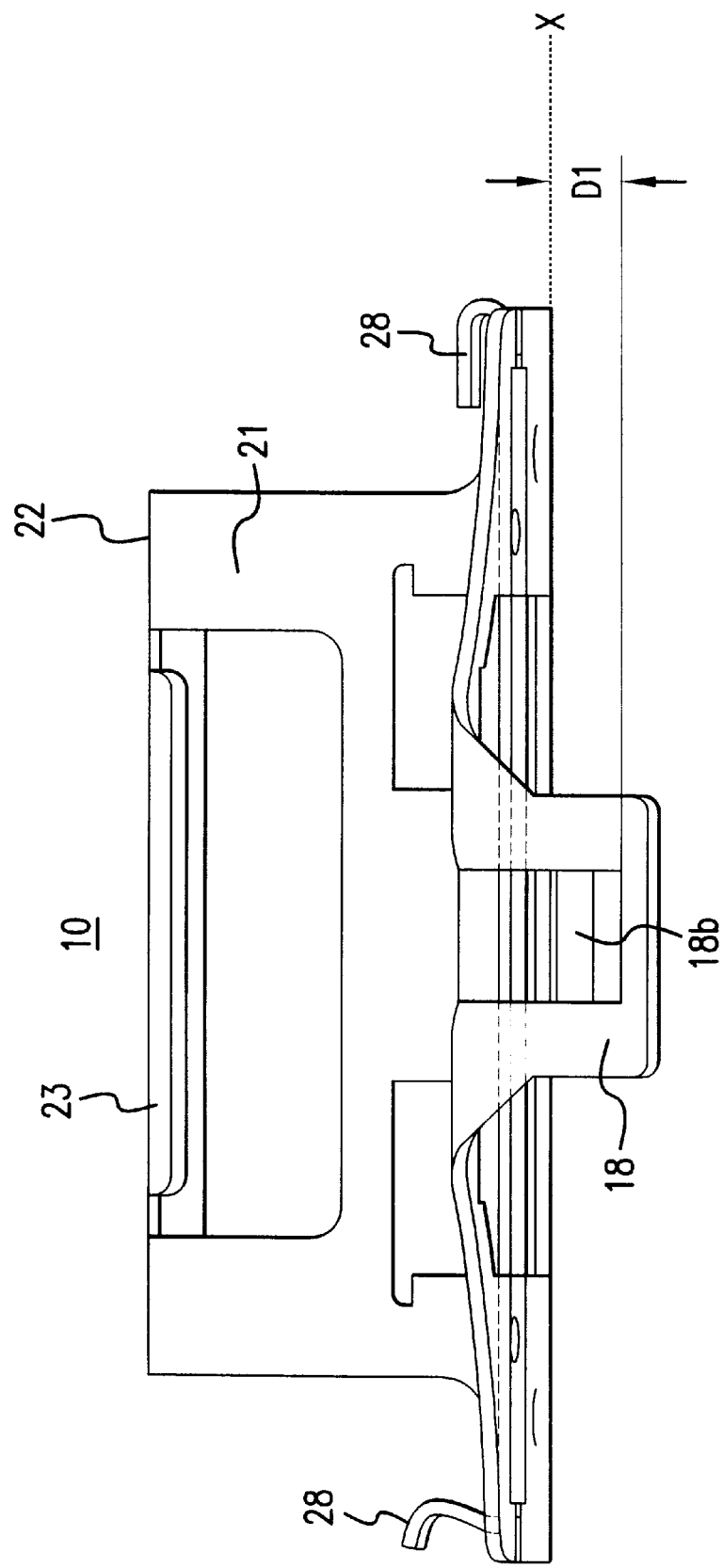
FIG. 7 is a view of a spring clip from a hinge side thereof.

A magnitude of the load F depends on several factors. The first factor includes an arm swing of the hinge arms 36. The arm swing is determined by the bend distance K from the rocking axis Y—Y, the angle of inclination (i.e. the first angle C) of the first segment 36a, a distance D1 of the aperture 18b from the base plane X as illustrated in FIG. 7, and a tensile strength of the material for the spring clip 10.

The second factor includes an arm swing of the latch arms 37. The arm swing is determined by the inclination of the first and second sections (19, 20) along angular planes defined by the first and second pressure angles (D, E) and the distance of the vertices (L, N) of those pressure angles (D, E) from the rocking axis Y—Y are important in establishing the load F along the load axis B—B and colinear with the center axis C—C of the component 4 and the heat sink axis A—A.

In another embodiment of the present invention, a method for inserting and locking the cooling device 2 in the spring clip 10 and then hinging and latching the spring clip 10 to the connector 3 is illustrated in FIGS. 1, 2a, 2c, and 3.

Figure 2A:
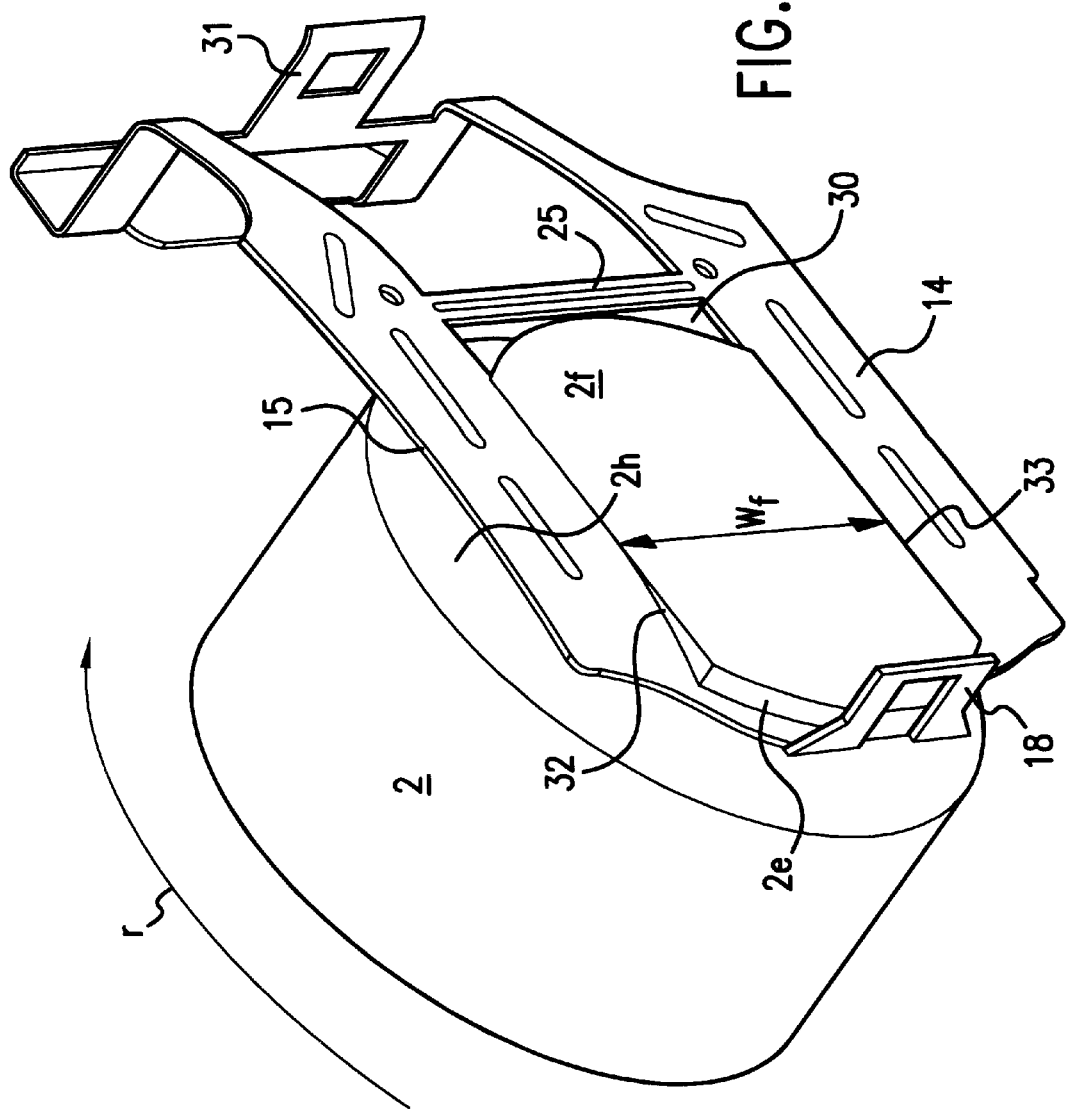
FIG. 2a is an isometric view of insertion of a heat sink into a spring clip according to the present invention.

In FIGS. 2a and 3, the base 2e of the cooling device 2 is positioned so that flats 33 are aligned with internal sides 32 of the ribs (14, 15). The flats 33 are planar surfaces that are substantially parallel to each other and are positioned on opposite sides of the base 2e and have a width W. measured between the flats 33 that is less than a width W of the opening 30 (i.e. $W_f$<W). For instance, the base 2e can have an arcuate or cylindrical shape and the flats 33 can be formed by machining (e.g. milling) the base 2e to form two opposed and parallel faces to define the flats 33.

After aligning the flats 33, the base 2e is inserted in the opening 30 until the ribs (14, 15) are in contact with a lower surface 2h of the cooling device 2 so that the contact surface 2g (see FIG. 2b) is positioned below the base plane X. Next, the cooling device 2 and/or the spring clip 10 undergo a rotation r as illustrated in FIG. 2a until the flats 33 are substantially parallel (i.e. a rotation of about 90.0 degrees) with the rocking axis Y—Y and the vertex V of the arcuate profile of the ribs (14,15) is in contact with the contact surface 2g and the load axis B—B is substantially aligned with the heat sink axis A—A. Finally, the locking rib 28 is inserted into the notches (26, 27) and registers and locks the base 2e in the spring clip 10 by abutting with one of the flats 33 so that the cooling device 2 can not be rotated and be removed from the opening 30.

In one embodiment of the present invention, the bridge 25 includes a nipple 25a (see FIG. 3) that is integral with the bridge 25 and extends outward of the bridge 25 and into the opening 30 and is operative to center the cooling device 2 in the opening 30 so that the heat sink axis A—A and the load axis B—B are substantially colinear with each other when the cooling device 2 is inserted and locked in the spring clip 10. With the locking rib 28 inserted, the neck 2d is urged toward the nipple 25a and the nipple 25a serves as a mechanical stop that registers the neck 2d within the opening 30.

Removal of the cooling device 2 from the spring clip 10 is the opposite of insertion. First the locking rib 28 is removed followed by the rotation r of the cooling device 2 and/or the spring clip 10 until the flats 33 are substantially parallel with the internal sides 32. Next, the base 2e is pulled through the opening 30 to remove the cooling device 2.

In FIGS. 2c and 4, with the cooling device 2 inserted and locked in the spring clip 10, the spring clip 10 is removably connected with the connector 3 by urging the hinge 18 into engagement with the tab 8 until the aperture 18b slips over the tab 8 with the tab 8 inserted through the aperture 18b. Next, the spring clip 10 is latched to the connector 3 by urging the latch 31 into engagement with the tab 7 until the aperture 31a slips over the tab 7 with the tab 7 inserted through the aperture 31a. The handle 22 may be urged inward towards the rocking axis Y—Y to cause the latch 31 to pivot outward to facilitate engagement with the tab 7. The handle 22 can be urged inward by gripping the handle 22 with the fingers of a hand (not shown), for example.

The aforementioned thermal interface material 5 can be positioned on the face 9 and/or the mounting surface 2f prior to connecting the spring clip 10 with the connector 3.

In another embodiment of the present invention as illustrated in FIG. 1, a first end portion 47 of the hinge 18 is inclined at an angle with respect to the hinge plane H. The first end portion 47 is positioned below the aperture 18b and the first end portion 47 eases engagement of the hinge with the tab 8. Similarly, in yet another embodiment of the present invention, a second end portion 49 of the latch 31 is inclined at an angle with respect to the latch plane 21. The second end portion 49 is positioned below the aperture 31a and the second end portion 49 eases engagement of the latch 31 with the tab 7.

In one embodiment of the present invention, as illustrated in FIGS. 1 and 4, the spring clip 10 is disconnected from the connector 3 by urging the handle 22 inward towards the rocking axis Y—Y so that the latch plane 21 rotates inward as shown by arrow 61 and the latch 31 rotates outward as shown by arrow 63 to facilitate easy disengagement of the aperture 31a from tab 7. The aperture 18b of the hinge 18 can then be easily disengaged from the tab 8 by rotating the spring clip 10 in the direction shown by arrow 65 until the aperture 18b disengages itself from the tab 8.

In another embodiment of the present invention as illustrated in FIGS. 3 and 9, the ribs (14, 15) include at least one embossed feature 29 formed in each rib and extending outward of the rib in a direction that is away from the base plane X. In FIG. 9, the ribs (14, 15) include a plurality of the embossed feature 29 (three are shown on each rib). Whereas in FIG. 3, the ribs (14,15) include one embossed feature 29 per rib and the embossed feature 29 spans a substantial portion of both the hinge and latch arms (36, 37). The embossed feature 29 increases the strength of the spring clip 10 and helps the spring clip 10 rock on the cooling device 2 thereby accommodating the aforementioned manufacturing variations without changing the load axis B—B.

The spring clip 10 can be manufactured using metal stamping and forming processes that are well understood by those skilled in the metal working art. Preferably, the spring clip 10 is stamped from spring quality stainless steel. As stamped, initially, the spring clip 10 is a planar piece including the ribs (14, 15), the bridge 25, the hinge 18 and aperture 18b, the latch 31 and aperture 31a, and the handle 22. The embossed feature 29 can also be formed during the stamping process.

The rocking angle A, the arcuate profile, the inclination of the first segment 36a, the inclination of the first and second portions (19, 20), the declination of the hinge and latch planes (H, 21), the inclination of the handle 22 relative to the latch plane 21, the inclination of the first and second end portions (47, 49) of the hinge 18 and the latch 31 respectively can be formed in the spring clip 10 after the stamping process.

Figure 8A:
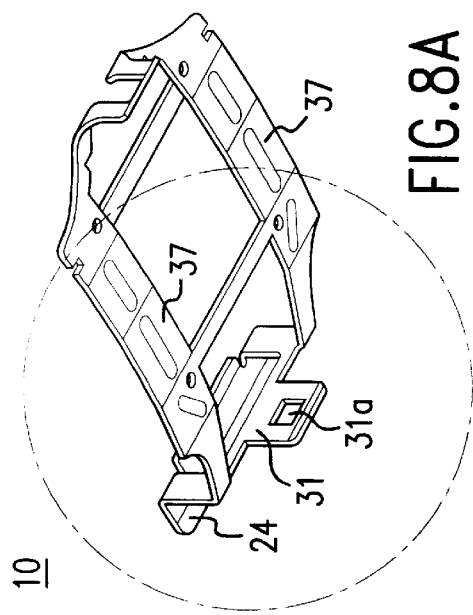
FIGS. 8a and 8b are schematic drawings illustrating a handle side flip bend according to the present invention.
Figure 8B:
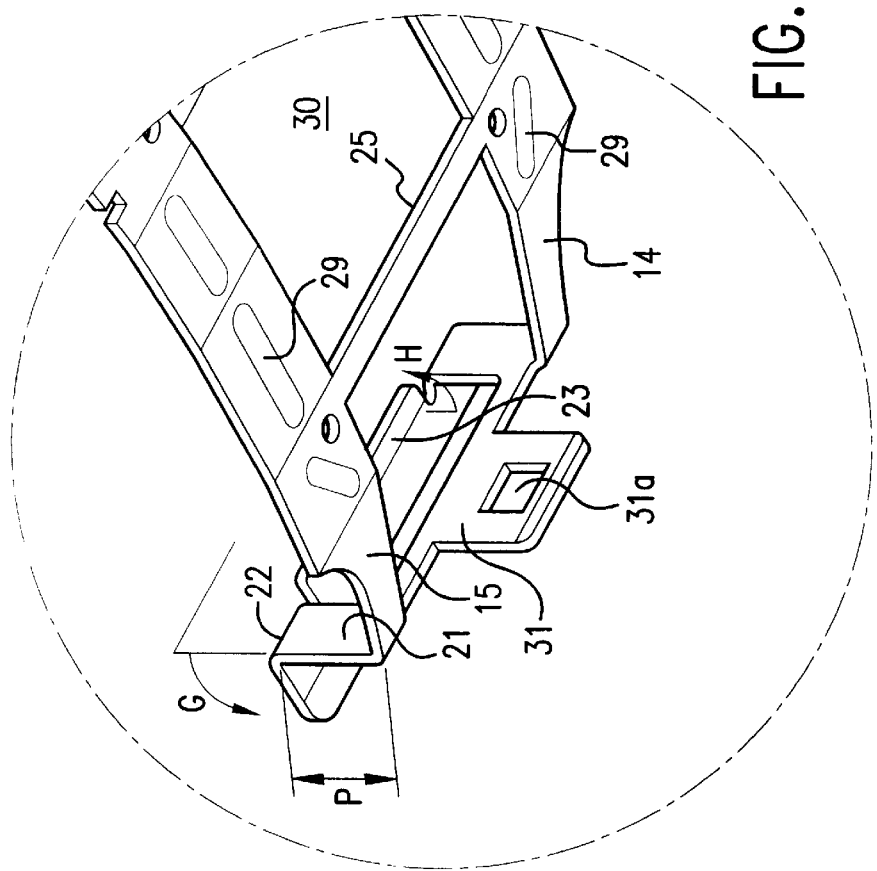

FIGS. 8a and 8b, illustrate the handle 22 and formation of an inside blended portion 23 and an outside blended portion 24. The inside blended portion 23 is declined at an angle towards the base plane X and the inside blended portion 23 has a width that is less than the width of the handle 22 (see FIGS. 7 and 9). The outside blended portion 24 is also declined at an angle towards the base plane X; however, the outside blended portion 24 has a width that is substantially the same as the width of the handle 22 (see FIGS. 5 and 9).

Figure 5:
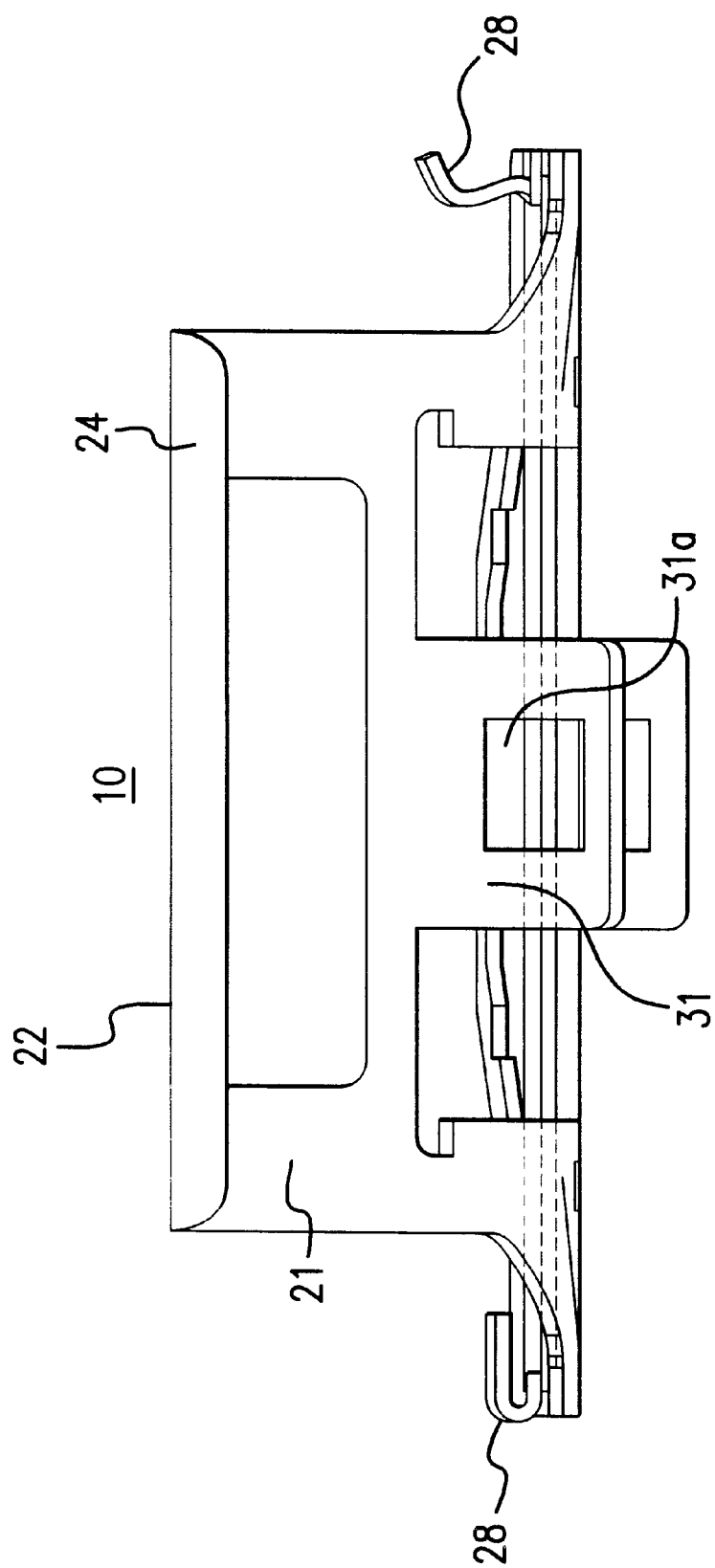
FIG. 5 is a view of a spring clip from a latch side thereof.

After stamping the spring clip 10, the handle 22 is a substantially planar surface. The handle 22 is formed by first bending the ribs (14,15) of the latch arms 37 at substantially a right angle with the base plane X at a distance P above the base plane X (see FIG. 8b) so that the bent portion of the ribs (14,15) lies on the latch plane 21 and the latch 31 lies on the latch plane 21. The inside and outside blended portions (23, 24) can then be formed in the handle 22 followed by bending the handle 22 at an angle with respect to the latch plane 21 as shown by arrow G in FIG. 8b. The bending causes the inside blended portion 23 to flip inside as shown by arrow H. This flipping helps to economize on the material used for the spring clip 10. The inside and outside blended portions (23, 24) can be bent downward toward the base plane X to blend and edge of the inside and outside blended portions (23, 24) as illustrated in FIGS. 7 and 5 respectively.

Preferably, the material for the spring clip 10 and the locking rib 28 is a SS 300 or a SS 400 grade material. For instance, the spring clip 10 can be made from SS 300 or SS 301 grade material. The SS 300 and SS 301 grade materials are a spring quality material and have the added advantages of being corrosion resistant and not requiring heat treatment or annealing. Preferably, the spring clip 10 is made from SS 301 grade material as it has better corrosion resistance and spring properties compared to other materials.

Combination and progressive tools can be used to punch, carry forward, form, and separate the spring clip 10 and the locking rib 28. The edges of the spring clip 10 and the locking rib 28 should be coined to remove burrs and sharp corners followed by a vibrofinish process to blend the edges and clean the parts.

A combination tool is a tool that includes cutting processes, such as blanking and piercing, and non-cutting processes, such as forming and drawing. A progressive tool is one in which the final spring clip 10 part is obtained by progression processing within the tool. That is, a sheet of the material from which the spring clip 10 is made is fed into the tool, the part profiles are punched or formed stage by stage. For the spring clip 10, the combination tool is used in conjunction with the progressive tool; however, the spring clip 10 can be produced using many different tools. For example, stage tools can be used to fabricate the spring clip 10. Vibrofinishing is a process that uses a soft compound to remove burrs from the spring clip 10. The compound collides and brushes over the spring clip 10 due to vibration created by the vibrofinishing machine. Consequently, the burrs are removed without damaging the spring clip 10.

The locking rib 28 can be formed and punched from the same sheet of SS 300 or SS301 grade material as the spring clip 10. For instance, the material that is punched out between the ribs (14, 15) as a waste material can be used to make the locking rib 28. Hence, the locking rib 28 can also be punched, carried forward, formed, and separated using the combination and progressive tools used for manufacturing the spring clip 10.

Figure 11:
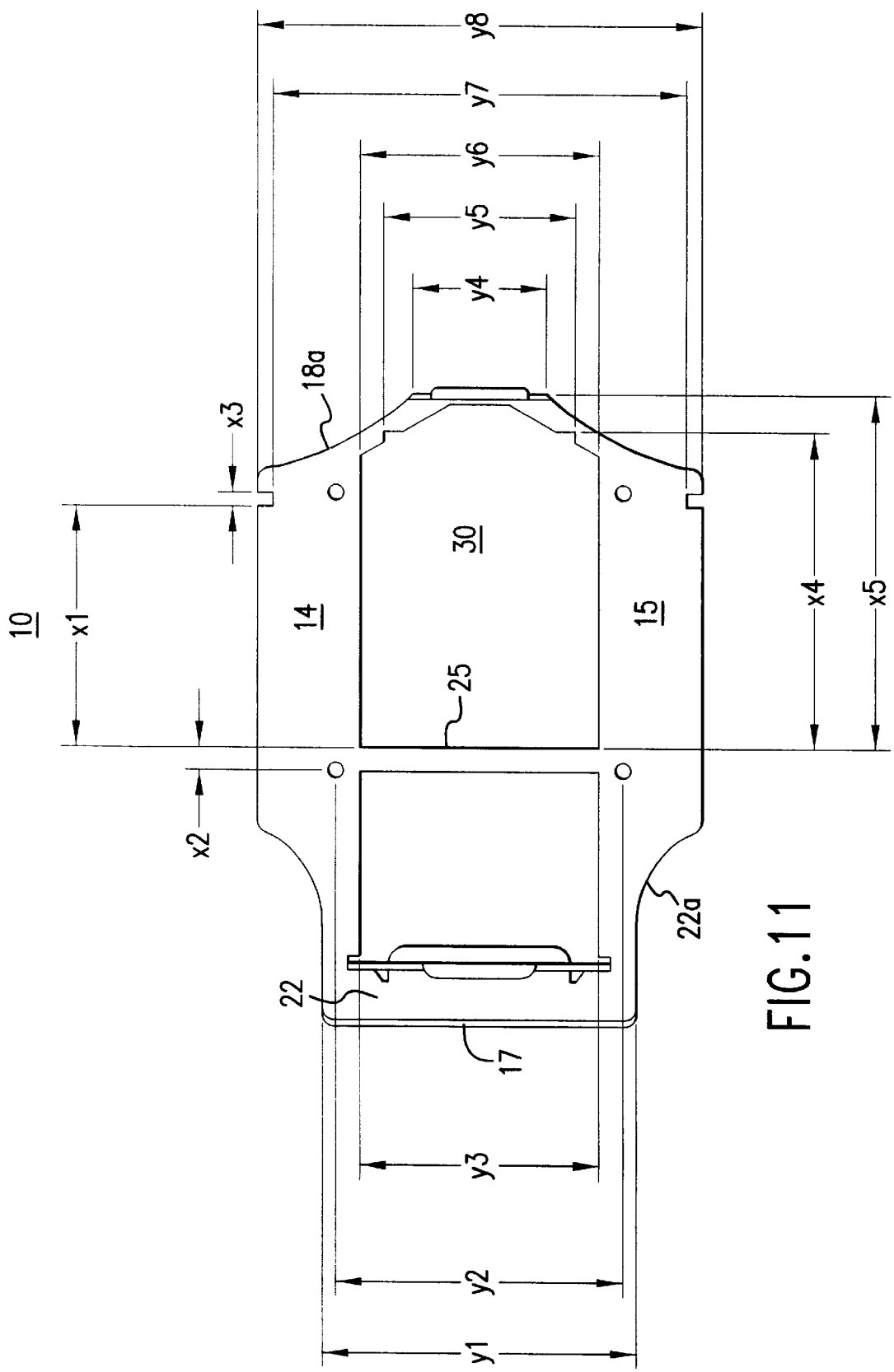
FIG. 11 is a top plan view illustrating example dimensions of a spring clip according to the present invention.
Figure 12:
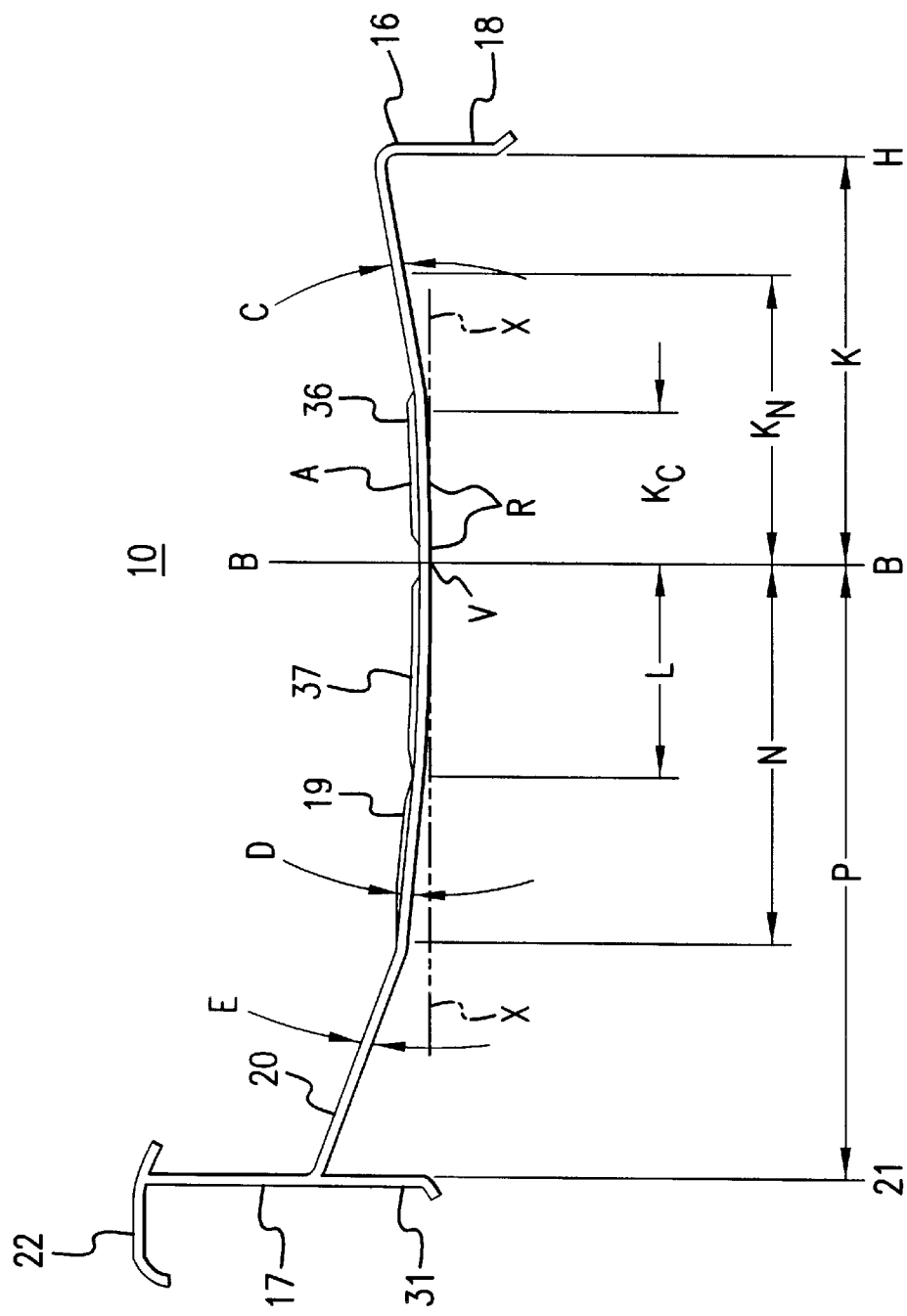
FIG. 12 is a schematic view illustrating example dimensions and angles for a spring clip according to the present invention.

In FIGS. 11 and 12, the spring clip 10 constructed with example dimensions that follow, has a measured contact resistance of about 0.02 waft per degree Celsius to about 0.08 watt per degree Celsius. For the contact resistance of about 0.08 watt per degree Celsius, the load F is about 10.0 lbs and for the contact resistance of about 0.02 watt per degree Celsius, the load F is about 22.0 lbs. The contact resistance of prior spring clips range from about 0.18 watt per degree Celsius and upward. The increase in contact resistance of the prior spring clips can be attributed to several factors; however, the main contributors to increased contact resistance are the prior spring clip not locating the heat sink flat on the components surface thereby creating thermally non-conductive air gaps between the component and the heat sink and the prior spring clip not exerting enough contact force.

In FIG. 11, by way of example only, exemplary dimensions for the spring clip 10 in millimeters are: y1=37 mm; y2=34 mm; y3=28 mm; y4=16 mm; y5=22 mm; y6=28.1 mm; y7=48.2 mm; y8=52 mm; x1=28 mm; x2=3mm; x3=1.5 mm; x4=36.8 mm; and x5=41.5mm. Those dimensions are example dimensions only, and the spring clip 10 of the present invention is not to be construed as being limited to those dimensions.

In FIG. 12, by way of example only, exemplary dimensions (in millimeters) and angles (in degrees) for the spring clip 10 include: the third distance P=40 mm; the second distance N=25 mm; the first distance L=14 mm; the bend distance K=27 mm; a distance from the rocking axis Y—Y to the vertex for the first angle C of $K_c$=10 mm; a distance from the rocking axis Y—Y to the notches (26, 27) of $K_N$=19 mm; the rocking angle A=2.0 degrees; the first angle C=10.0 degrees; the first pressure angle D=6.0 degrees; the second pressure angle E=20 degrees; and the rocking radius R=10.0 mm. Those dimensions and angles are example dimensions and angles only, and the spring clip 10 of the present invention is not to be construed as being limited to those dimensions or angles.

Although several embodiments of the present invention have been disclosed and illustrated, the invention is not limited to the specific forms or arrangements of parts so described and illustrated. The invention is only limited by the claims.

What is claimed is:

1. A spring clip for mounting a cooling device to a component carried by a connector, comprising:

a plurality of spaced apart ribs that are substantially parallel and coplanar to each other, the ribs including a latch arm and a hinge arm positioned astride a rocking axis disposed substantially perpendicular to the ribs and lying on a base plane, the latch and hinge arms are inclined at a rocking angle having a vertex at the rocking axis, each hinge arm including a first segment inclined at a first angle, a hinge declined at a bend distance from the rocking axis so that the hinge is positioned on a hinge plane, the ribs in the hinge converge on each other defining an aperture adapted to be movably hinged on the connector, and at least one notch formed in the ribs and adapted to receive a removable locking rib operative to lock the cooling device in the spring clip, each latch arm including a first section inclined at a first pressure angle having a vertex at a first distance from the rocking axis, a second section inclined at a second pressure angle having a vertex at a second distance from the rocking axis;

a bridge substantially parallel to the rocking axis and connected With the latch arms and defining an opening through which the cooling device is inserted; and a latch assembly connected with the ribs of the latch arms and inclined at a third distance from the rocking axis so that the latch assembly is positioned on a latch plane, the latch assembly including a latch having an aperture therein adapted to removably latch the spring clip with the connector, and a handle inclined at a second angle with respect to the latch plane.

2. The spring clip as set forth in claim 1 wherein the ribs further include at least one embossed feature formed thereon and extending outward of the ribs in a direction away from the base plane.

3. The spring clip as set forth in claim 1 wherein the spring clip is made from a spring quality material.

4. The spring clip as set forth in claim 3 wherein the spring quality material is a material selected from the group consisting of a metal, steel, and stainless steel.

5. The spring clip as set forth in claim 1 wherein the spring clip, excluding the locking rib, is a homogeneously formed integral unit.

6. The spring clip as set forth in claim 1 wherein the hinge plane is substantially at a right angle with respect to the base plane.

7. The spring clip as set forth in claim 1 wherein the latch plane is substantially at a right angle with respect to the base plane.

8. The spring clip as set forth in claim 7 wherein the second angle of the handle is substantially at a right angle with respect to the latch plane.

9. The spring clip as set forth in claim 1 wherein at the rocking axis, the ribs have an arcuate profile that is substantially tangential with the base plane at the rocking axis.

10. The spring clip as set forth in claim 9 wherein the arcuate profile is a substantially circular profile defined by a rocking radius of a circle having a perimeter that is substantially tangential with the base plane at the rocking axis.

11. The spring clip as set forth in claim 1 wherein the handle further includes an inside blended portion that is narrower in width than the handle and an outside blended portion of substantially the same width as the handle, the inside and outside blended portions are declined towards the base plane.

12. The spring clip as set forth in claim 1 wherein the bridge further comprises a nipple integral therewith and extending outward of the bridge and into the opening, the nipple adapted to center the cooling device in the opening.

13. The spring clip as set forth in claim 1 and further comprising:
 a first end portion positioned below the aperture of the hinge and inclined at an angle with respect to the hinge plane, the first end portion adapted to ease engagement between the hinge and the connector; and
 a second end portion positioned below the aperture of the latch and inclined at an angle with respect to the latch plane, the second end portion adapted to ease engagement between the latch and the connector.

14. The spring clip as set forth in claim 1 and further comprising a method of connecting the cooling device with the spring clip, comprising:
 positioning a base of the cooling device so that a pair of flats on the base are aligned with an internal side of the ribs;
 inserting the base through the opening so that a contact surface of the base is positioned below the base plane;
 rotating the base until the flats are substantially parallel to the rocking axis and the vertex of the rocking axis is in contact with the contact surface; and
 inserting the locking rib into the notches so that the locking rib is in contact with one of the flats thereby registering and locking the base in the spring clip.

15. The method as set forth in claim 14 and further comprising a method for connecting the spring clip with the connector, comprising:
 urging the hinge into engagement with a tab on the connector until the tab is inserted through the aperture of the hinge; and
 urging the latch into engagement with a tab on an opposite side of the connector until the tab is inserted through the aperture in the latch.

16. The method as set forth in claim 15 wherein the hinge and the latch are urged into engagement with the tabs by gripping the handle with the fingers of a hand.

17. The method as set forth in claim 15 and further comprising:
 prior to connecting the spring clip with the connector;
 applying a thermal interface material to a surface selected from the group consisting of a mounting surface of the cooling device, a face of the component to be cooled, an d a mounting surface of the cooling device and face of the component to be cooled.

18. A cooling system, comprising:
 a connector;
 a component coupled with the connector;
 a cooling device in contact with the component;
 a spring clip for urging the cooling device and the component into contact with each other and adapted to be removably connected with the connector, the spring clip including:
  a plurality of spaced apart ribs that are substantially parallel and coplanar to each other, the ribs including a latch arm and a hinge arm positioned astride a rocking axis disposed substantially perpendicular to the ribs and lying on a base plane, the latch and hinge arms are inclined at a rocking angle having a vertex at the rocking axis,
  each hinge arm including a first segment inclined at a first angle, a hinge declined at a bend distance from the rocking axis so that the hinge is positioned on a hinge plane, the ribs in the hinge converge on each other defining an aperture adapted to be movably hinged on the connector, and at least one notch formed in the ribs and adapted to receive a removable locking rib operative to lock the cooling device in the spring clip,
  each latch arm including a first section inclined at a first pressure angle having a vertex at a first distance from the rocking axis, a second section inclined at a second pressure angle having a vertex at a second distance from the rocking axis;
  a bridge substantially parallel to the rocking axis and connected with the latch arms and defining an opening through which the cooling device is inserted; and
  a latch assembly connected with the ribs of the latch arms and inclined at a third distance from the rocking axis so that the latch assembly is positioned on a latch plane, the latch assembly including a latch having an aperture therein adapted to removably latch the spring clip with the connector, and a handle inclined at a second angle with respect to the latch plane.

19. The cooling system of claim 18 and further comprising:
 a thermal interface material positioned intermediate between the cooling device and the component and in contact with the cooling device and the component.

20. The cooling system of claim 19 wherein the thermal interface material is a material selected from the group consisting of a thermally conductive paste, a thermally conductive grease, silicone, paraffin, a silicon substrate, a phase transition material, graphite, and carbon fiber.

* * * * *